US012757610B2

(12) United States Patent
Lee et al.

(10) Patent No.: US 12,757,610 B2
(45) Date of Patent: Oct. 6, 2026

(54) DISPLAY DEVICE AND ELECTRONIC DEVICE

(71) Applicant: Samsung Display Co., Ltd., Yongin-Si (KR)

(72) Inventors: Kyungsu Lee, Yongin-si (KR); Dongjin Moon, Yongin-si (KR); Junseok Min, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 19/072,058

(22) Filed: Mar. 6, 2025

(65) Prior Publication Data

US 2025/0366342 A1 Nov. 27, 2025

(30) Foreign Application Priority Data

May 21, 2024 (KR) ........................ 10-2024-0065969

(51) Int. Cl.
*G06F 3/041* (2006.01)
*G06F 3/044* (2006.01)
*H10K 59/40* (2023.01)

(52) U.S. Cl.
CPC ......... *H10K 59/40* (2023.02); *G06F 3/04164* (2019.05); *G06F 3/0446* (2019.05)

(58) Field of Classification Search
None
See application file for complete search history.

(56) References Cited

U.S. PATENT DOCUMENTS 11,385,747 B2 7/2022 Yang et al.
2011/0134056 A1* 6/2011 Kim ...................... G06F 3/0412 345/173
2011/0169813 A1 7/2011 Jin et al.
2017/0285779 A1* 10/2017 Ryu ...................... G06F 3/0446
2021/0132765 A1* 5/2021 Roh ...................... H10K 59/40

FOREIGN PATENT DOCUMENTS

KR 1020110081442 A 7/2011
KR 1020210145020 A 12/2021

* cited by examiner

*Primary Examiner* — Krishna P Neupane
(74) *Attorney, Agent, or Firm* — Innovation Counsel LLP

(57) ABSTRACT

Disclosed is a display device including a display panel including a first base substrate, a second base substrate, and a sealing member, and an input sensor and including an active area, a pad area, and a sealing area, wherein the input sensor includes a sensing electrode that senses an input, a sensing pad overlapping the pad area and including a first pad and a second pad, and a sensing line, the sealing area extends in a first direction parallel to an edge of the display panel and is positioned a predetermined distance from the edge in a second direction intersecting the first direction, the first pad includes a first portion extending parallel to the second direction and a second portion extending parallel to the first direction, and the second portion is disposed at least the predetermined distance from the edge of the display panel.

20 Claims, 13 Drawing Sheets

DISPLAY DEVICE AND ELECTRONIC DEVICE

CROSS-REFERENCE TO RELATED APPLICATION(S)

This application claims priority, under 35 U.S.C. § 119, to Korean Patent Application No. 10-2024-0065969 filed on May 21, 2024 in the Korean Intellectual Property Office, the disclosure of which is incorporated by reference herein.

BACKGROUND

Embodiments of the present disclosure described herein relate to a display device, and more particularly to a display device including an input sensor.

Various display devices used in multimedia electronic devices such as televisions, mobile phones, tablet computers, navigation devices, and game consoles have been developed. Input devices of the display devices include a keyboard, a mouse, or the like. Further, the display devices are provided with an input sensor such as a touch panel as the input device.

Various defects may occur in a process of manufacturing the display device and in the manufactured display device. These defects may also occur in the input sensor.

SUMMARY

Embodiments of the present disclosure provide a display device capable of maintaining a desired level of durability for a longer time by ensuring that the curing of a sealing member is not compromised by the presence of metal near an input sensor of a pad part during the curing process.

According to an embodiment, a display device includes a display panel including a first base substrate, a second base substrate, and a sealing member positioned at edges of the first base substrate between the first base substrate and the second base substrate, and an input sensor disposed on the display panel and including an active area, a pad area adjacent to the active area, and a sealing area partially overlapping the pad area and overlapping the sealing member, wherein the input sensor includes a sensing electrode that senses an input, a sensing pad overlapping the pad area and including a first pad and a second pad disposed on a different layer from the first pad and electrically connected to the first pad, and a sensing line electrically connecting the sensing electrode and the sensing pad, the sealing area extends in a first direction parallel to an edge of the display panel and is positioned a predetermined distance from the edge in a second direction intersecting the first direction, the first pad includes a first portion extending parallel to the second direction and a second portion extending parallel to the first direction, and the second portion is disposed at least the predetermined distance from the edge of the display panel.

A distance between the sealing area and the edge of the display panel may be 80 micrometers or less.

The first portion may be provided as a plurality of first portions, and at least one first portion among the plurality of first portions may extend to the edge of the display panel.

The sensing pad may include the first pad, a first insulating layer disposed on the first pad, the second pad disposed on the first insulating layer, and a second insulating layer disposed on the second pad.

The sensing pad may include a pad part partially overlapping the sealing area and an edge part extending from the pad part to the edge of the display panel on a plane, and an opening in first insulating layer is positioned in the edge part and extends to the first pad.

A first contact hole electrically connecting the first pad and the second pad may be defined in the first insulating layer overlapping the pad part.

A second contact hole exposing the second pad may be defined in the second insulating layer overlapping the pad part.

The second insulating layer may cover the second pad.

The second pad may be positioned outside of the edge part.

The second portion may be spaced farther apart from the edge than from the sealing area.

The display panel may further include a circuit element layer disposed between the first base substrate and the second base substrate, and a display element layer disposed on the circuit element layer.

The first pad may include metal, and the second pad may include a transparent conductive oxide.

A distance between the second portion and the sealing area may be 40 μm or more.

The first pad may be in contract with an upper surface of the second base substrate.

According to an embodiment, an electronic device includes an electronic panel and a window member disposed on the electronic panel, wherein the electronic panel includes a display panel including a first base substrate, a second base substrate, and a sealing member that is positioned at edges of the first base substrate between the first base substrate and the second base substrate, and an input sensor disposed on the display panel and including an active area, a pad area adjacent to the active area, and a sealing area partially overlapping the pad area and overlapping the sealing member, wherein the input sensor includes a sensing electrode that senses an input, a sensing pad overlapping the pad area and including a first pad and a second pad disposed on a different layer from the first pad and electrically connected to the first pad, and a sensing line electrically connecting the sensing electrode and the sensing pad, the sealing area extends parallel to an edge of the display panel and is spaced a predetermined distance from the edge, and the first pad disposed between the sealing area and the edge extends only in a direction that is nonparallel to the edge.

A distance between the sealing area and the edge of the display panel may be 80 micrometers or less.

The sensing pad may include the first pad, a first insulating layer disposed on the first pad, the second pad disposed on the first insulating layer, and a second insulating layer disposed on the second pad.

The sensing pad may include a pad part partially overlapping the sealing area and an edge part extending from the pad part to the edge of the display panel, wherein an opening in the first insulating layer is positioned in the edge part and extends to the first pad.

A first contact hole electrically connecting the first pad and the second pad may be defined in the first insulating layer overlapping the pad part.

The first pad may include metal, and the second pad may include a transparent conductive oxide.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
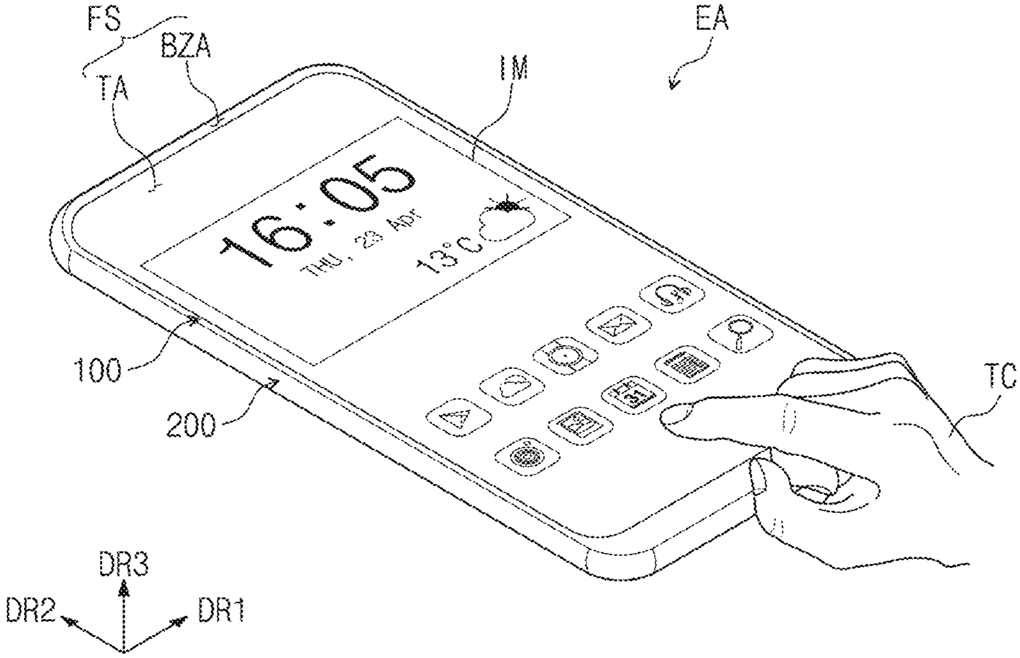
FIG. 1A is a perspective view of a display device according to an embodiment of the present disclosure.

In the present specification, the expression that a first component (or area, layer, part, portion, etc.) is “disposed on”, “connected with” or “coupled to” a second component means that the first component is directly disposed on/connected with/coupled to the second component or means that a third component is interposed therebetween.

The same reference numerals refer to the same components. Further, in the drawings, the thickness, the ratio, and the dimension of components are exaggerated for effective description of technical contents. The expression “and/or” includes one or more combinations which associated components are capable of defining.

Although the terms “first”, “second”, etc. may be used to describe various components, the components should not be limited by the terms. The terms are only used to distinguish one component from another component. For example, without departing from the right scope of the present disclosure, a first component may be referred to as a second component, and similarly, the second component may be also referred to as the first component. Singular expressions include plural expressions unless clearly otherwise indicated in the context.

Also, the terms “under”, “below”, “on”, “above”, etc. are used to describe the correlation of components illustrated in drawings. The terms that are relative in concept are described based on a direction illustrated in drawings.

It will be understood that the terms “include”, “comprise”, “have”, etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in the specification have the same meaning as commonly understood by those skilled in the art to which the present disclosure belongs. Further, terms defined should be construed as having the same meanings as those in the context of the related art, and are explicitly defined therein unless the terms are interpreted in an ideal or excessively formal meaning.

Hereinafter, an embodiment of the present disclosure will be described with reference to the accompanying drawings.

Figure 1B:
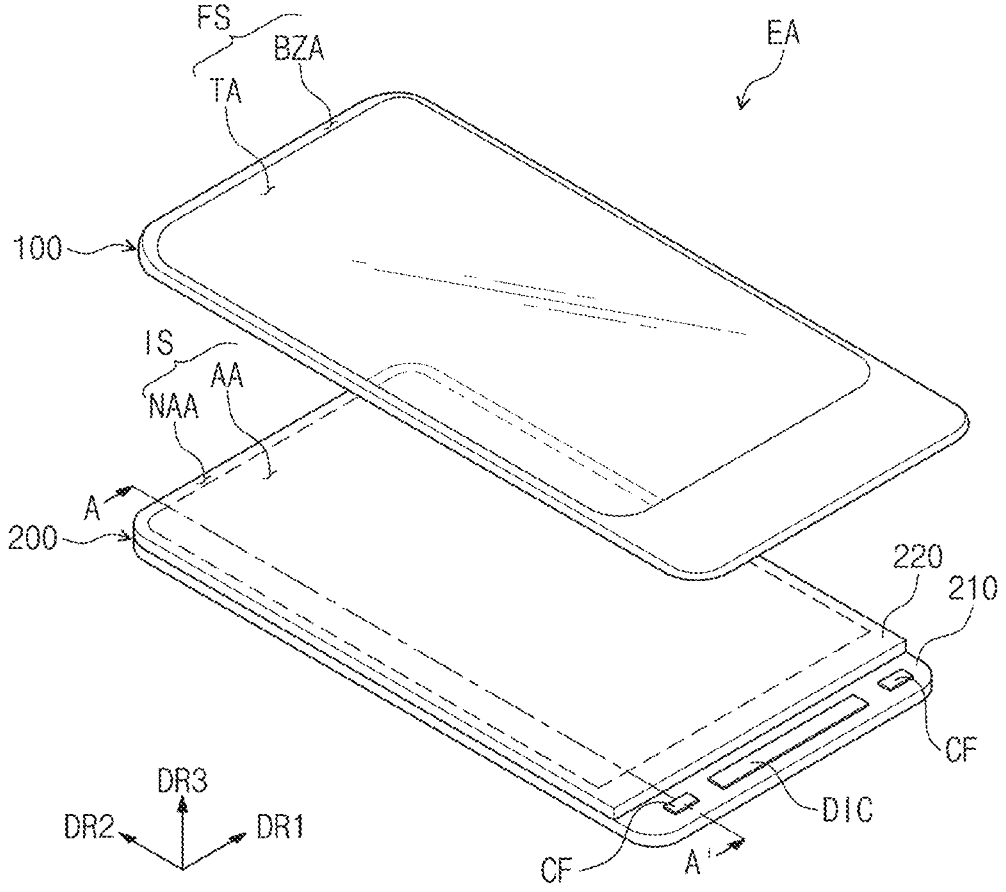
FIG. 1B is an exploded perspective view of the display device illustrated in FIG. 1A.
Figure 1C:
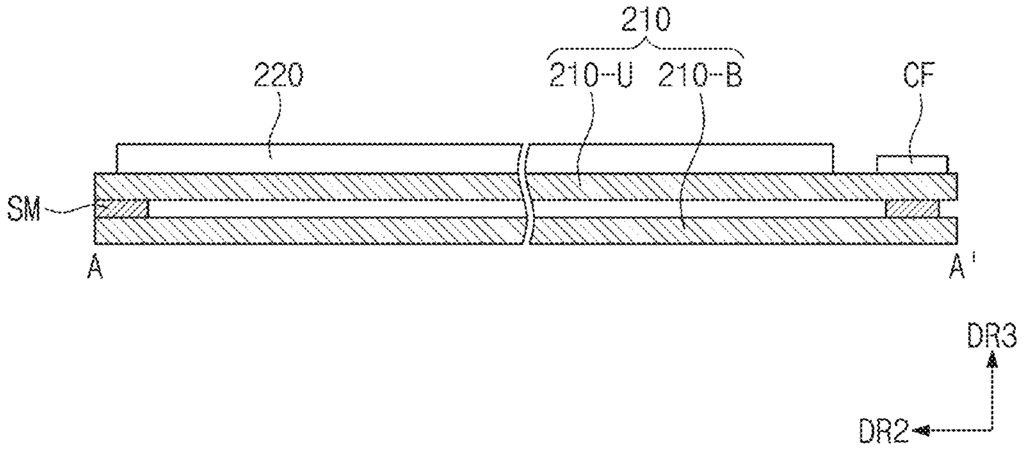
FIG. 1C is a cross-sectional view corresponding to line A-A' in FIG. 1B.

FIG. 1A is a perspective view of a display device EA according to an embodiment of the present disclosure. FIG. 1B is an exploded perspective view of the display device EA illustrated in FIG. 1A. FIG. 1C is a cross-sectional view corresponding to line A-A' in FIG. 1B. Hereinafter, the display device EA according to an embodiment will be described with reference to FIGS. 1A to 1C.

The display device EA may be a device that is activated according to an electric signal. The display device EA may be included in various electronic devices. For example, the electronic device may include a tablet, a laptop, a computer, a smart television, and the like. In an embodiment, the display device EA is illustrated as a smart phone.

The display device EA may display an image IM through a display surface FS. The display surface FS is parallel to a surface defined by a first direction DR1 and a second direction DR2. A normal direction of the display surface FS, that is, a thickness direction of the display device EA, is indicated by a third direction DR3. Front surfaces (or upper surfaces) and rear surfaces (or lower surfaces) of members or components, which will be described below, are differentiated by their positions along the third direction DR3. Hereinafter, the first to third directions DR1, DR2, and DR3 are defined as directions indicated by first to third direction axes and refer to the same reference numerals.

The display surface FS, on which the image IM is displayed, may correspond to a front surface of the display device EA and may correspond to a front surface FS of a window member 100. Hereinafter, the display surface and the front surface of the display device EA and the front surface of the window member 100 will be designated by the same reference numerals. FIG. 1A illustrates a clock and a plurality of icons as an example of the image IM.

The display device EA includes the window member 100 and an electronic panel 200. Although not separately illustrated, the display device EA may further include an optical member disposed between the window member 100 and the electronic panel 200. In an embodiment, the optical member may include a polarizer. In an embodiment, the optical member may include a color filter member that decreases reflectance of external light.

The window member 100 includes a base panel. For example, the base panel may include glass, plastic, or a combination thereof. The front surface FS of the window member 100 includes a transmissive area TA and a bezel area BZA. The transmissive area TA may be an optically transparent area. For example, the transmissive area TA may be an area having a visible light transmittance of about 90% or more.

The bezel area BZA may be an area having a relatively low light transmittance compared to the transmissive area TA. The bezel area BZA defines a shape of the transmissive area TA. The bezel area BZA may be adjacent to the transmissive area TA and surround the transmissive area TA. The window member 100 may further include a light shielding pattern disposed on the base panel and defining the bezel area BZA.

The bezel area BZA may have a predetermined color. The bezel area BZA may cover a peripheral area NAA of the electronic panel 200 and prevent the peripheral area NAA from being seen from the outside. In the window member 100 according to an embodiment of the present disclosure, a part or the entirety of the bezel area BZA may be omitted.

The electronic panel 200 may display the image IM and sense an external input TC. The image IM may be displayed on the front surface FS of the electronic panel 200. The front surface FS of the electronic panel 200 includes an active area AA and the peripheral area NAA. The active area AA may be an area that is activated according to an electrical signal. The active area AA may be an area in which pixels PX (see FIG. 2B), which will be described below.

In an embodiment, the active area AA may be an area where the image IM is displayed, and at the same time, an area where the external input TC is received. The active area AA corresponds to the transmissive area TA, and the peripheral area NAA corresponds to the bezel area BZA. In the specification, the phrase "an area/part A and an area/part B correspond to each other" means that "the area/part A and the area/part B at least partially overlap each other" and does not necessarily mean that the area/part A and the area/part B have the same area and/or the same shape.

The electronic panel 200 includes a display panel 210, an input sensor 220, a driving circuit DIC, and a flexible circuit board CF. Two flexible circuit boards CF are illustrated as an example.

The display panel 210 substantially generates the image IM. The display panel 210 may be a light emitting display panel. For example, the light emitting display panel may be an organic light emitting display panel, a quantum dot light emitting display panel, or a micro light emitting diode (LED) light emitting display panel. The panels are distinguished according to a composition of a light emitting element. A light emitting layer of the organic light emitting display panel may include an organic light emitting material. A light emitting layer of the quantum dot light emitting display panel may include a quantum dot and/or a quantum rod. A light emitting layer of the micro LED light emitting display panel may include a plurality of micro LEDs. Hereinafter, the display panel 210 will be described as the organic light emitting display panel.

The input sensor 220 senses an external input (e.g., a touch event) applied from an external unit. In an embodiment, the input sensor 220 may be a capacitive touch sensor, and the present disclosure is not particularly limited thereto.

The driving circuit DIC is disposed on the display panel 210. The driving circuit DIC may be mounted on the display panel 210. The driving circuit DIC is electrically connected to the display panel 210 and provides an electrical signal for driving the display panel 210 to the display panel 210.

The flexible circuit board CF is electrically connected to the input sensor 220. In an embodiment, a sensing driving circuit may be mounted on the flexible circuit board CF. The flexible circuit board CF may electrically connect the input sensor 220 and the display panel 210 or electrically connect the input sensor 220 and another flexible circuit board.

Referring to FIG. 1C, the display panel 210 includes a display substrate 210-B (or a first base substrate), an encapsulation substrate 210-U (or a second base substrate), and a sealing member SM that adheres the display substrate 210-B and the encapsulation substrate 210-U. The sealing member SM may adhere edges of the display substrate 210-B and the encapsulation substrate 210-U. The display substrate 210-B includes the pixels PX (see FIG. 2B) that substantially generate images. The encapsulation substrate 210-U seals the pixels PX and prevents the pixels PX from being damaged by external moisture.

The driving circuit DIC may be coupled to the display substrate 210-B. The driving circuit DIC may be provided in the form of an integrated chip. However, the present disclosure is not limited thereto, and in an embodiment, the driving circuit DIC may not be mounted on the display substrate 210-B.

The display substrate 210-B and the encapsulation substrate 210-U may include a glass substrate as a base substrate. The display substrate 210-B may have a larger area than the encapsulation substrate 210-U. The driving circuit DIC may be disposed in a part of the display substrate 210-B that is not covered by the encapsulation substrate 210-U. However, the present disclosure is not limited thereto, and in an embodiment, the display substrate 210-B and the encapsulation substrate 210-U may have substantially the same shape.

The sealing member SM may include, for example, a frit. The frit is a ceramic adhesive material that has a property of hardening after laser exposure. The frit may contain, as main ingredients, 15 wt % to 40 wt % of V205, 10 wt % to 30 wt % of $TeO_2$, 1 wt % to 15 wt % of $P_2O_5$, 1 wt % to 15 wt % of BaO, 1 wt % to 20 wt % of ZnO, 5 wt % to 30 wt % of $ZrO_2$, 5 wt % to 20 wt % of $WO_3$, and 1 wt % to 15 wt % of BaO and may contain, as additives, at least one of $Fe_2O_3$, CuO, MnO, $Al_2O_3$, $Na_2O$, and $Nb_2O_5$. The frit having this composition may have a thermal expansion coefficient of 40 to $100\times10^{-7}$/° C. and have a glass transition temperature of 250° C. to 400° C. The sealing member SM overlaps the peripheral area NAA.

Figure 2A:
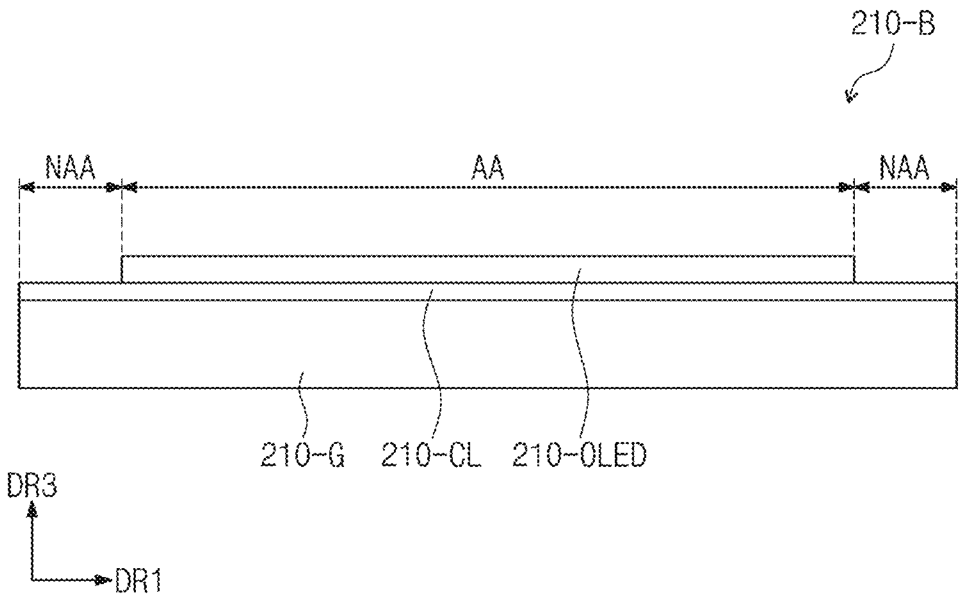
FIG. 2A is a cross-sectional view of a display substrate according to an embodiment of the present disclosure.
Figure 2B:
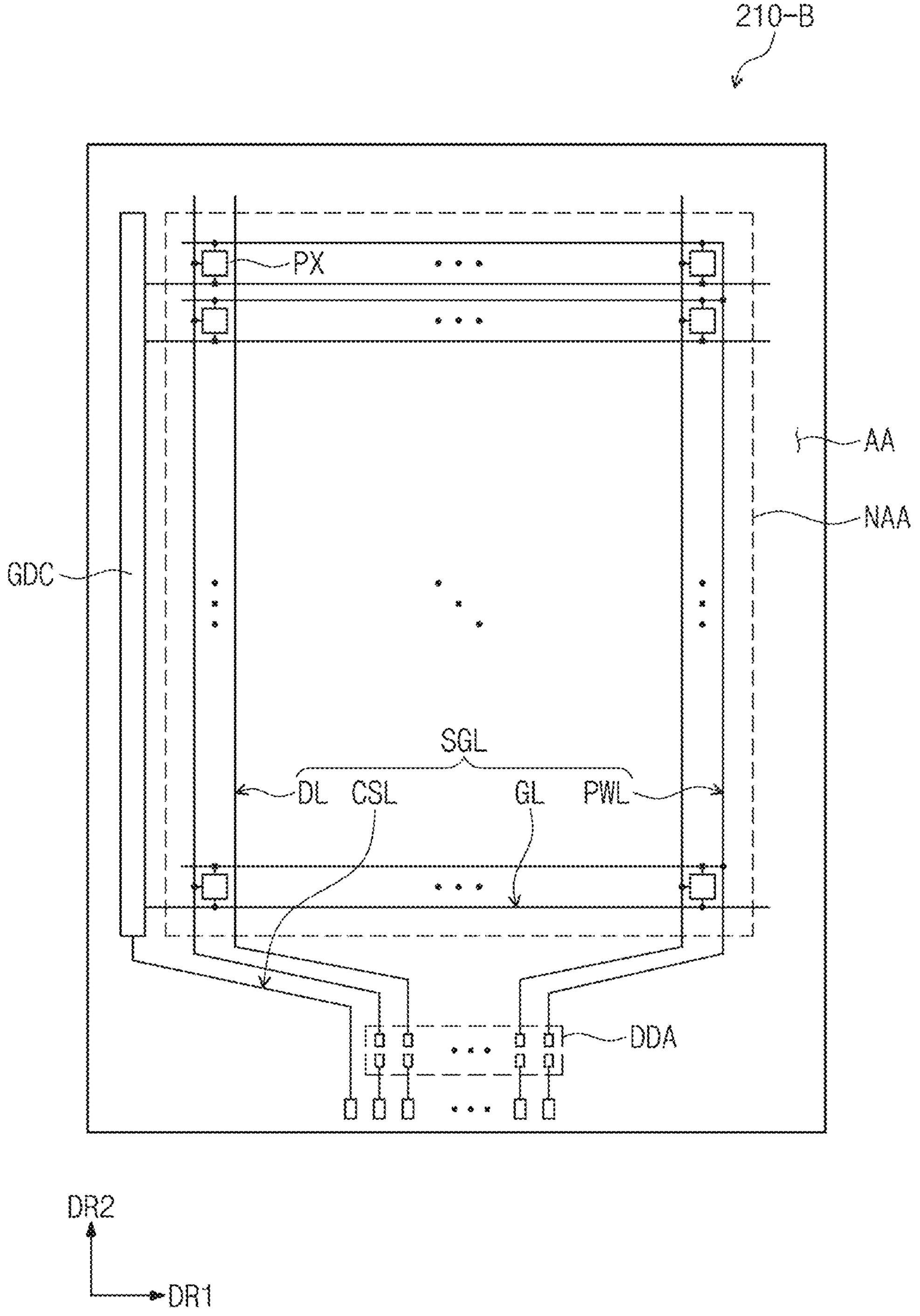
FIG. 2B is a plan view of the display substrate according to an embodiment of the present disclosure.

FIG. 2A is a cross-sectional view of the display substrate 210-B according to an embodiment of the present disclosure. FIG. 2B is a plan view of the display substrate 210-B according to an embodiment of the present disclosure. Hereinafter, the display substrate 210-B according to an embodiment of the present disclosure will be described with reference to FIGS. 2A to 2B.

As illustrated in FIG. 2A, the display substrate 210-B includes a base layer 210-G, a circuit element layer 210-CL disposed on an upper surface (or an inner surface) of the base layer 210-G, and a display element layer 210-OLED. The display substrate 210-B may further include an insulating layer that covers the display element layer 210-OLED.

The base layer 210-G may include a glass substrate, a metal substrate, an organic/inorganic composite material substrate, or the like. The circuit element layer 210-CL includes at least one insulating layer and a circuit element. The insulating layer includes at least one inorganic layer and at least one organic layer. The circuit element includes sensing lines and a pixel driving circuit. The display element layer 210-OLED includes at least organic light emitting diodes (OLEDs) as light emitting elements. The display element layer 210-OLED may further include an organic layer such as a pixel defining film.

As illustrated in FIG. 2B, the display substrate 210-B may include a driving circuit GDC, a plurality of sensing lines SGL (hereinafter, referred to as sensing lines), and the plurality of pixels PX (hereinafter, referred to as pixels). In FIG. 2B, "..." is used to indicate that the same connection is repeated, without overcrowding the figure.

The driving circuit GDC may include a scan driving circuit. The scan driving circuit generates a plurality of scan signals (hereinafter, referred to as scan signals) and sequentially outputs the scan signals to a plurality of scan lines GL (hereinafter, referred to as scan lines), which will be described below. The scan driving circuit may further output another control signal to driving circuits of the pixels PX.

The scan driving circuit may include a plurality of transistors formed through the same process as the driving circuit of the pixels PX, for example, through a low temperature polycrystalline silicon (LTPS) process and/or a low temperature polycrystalline oxide (LTPO) process.

The sensing lines SGL include the scan lines GL, data lines DL, a power line PWL, and a control signal line CSL. Each of the scan lines GL is connected to a corresponding pixel PX among the pixels PX, and each of the data lines DL is connected to a corresponding pixel PX among the pixels PX. The power line PWL is connected to the pixels PX. The control signal line CSL may provide control signals to the scan driving circuit.

FIG. 2B illustrates a mounting area DDA on which the driving circuit DIC (see FIG. 1B) is disposed. The driving circuit DIC may be connected to the data lines DL.

Figure 3:
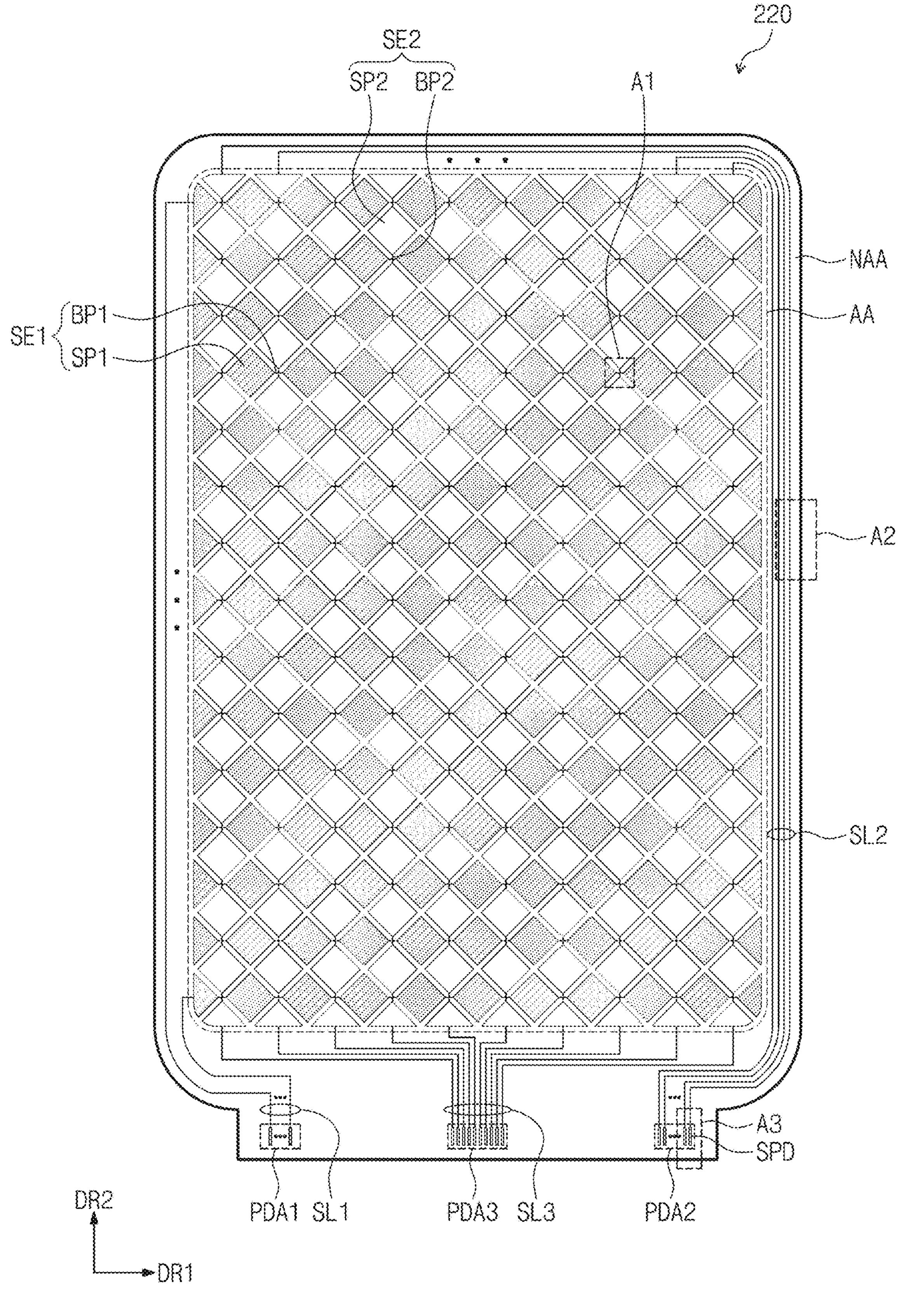
FIG. 3 is a plan view of an input sensor according to an embodiment of the present disclosure.

FIG. 3 is a plan view of the input sensor 220 according to an embodiment of the present disclosure. The input sensor 220 is disposed on the display panel 210 (see FIG. 1B). The input sensor 220 may include a plurality of sensing electrodes SE1 and SE2 and a plurality of sensing lines SL1, SL2, and SL3 connected to the plurality of sensing electrodes SE1 and SE2. The sensing electrodes SE1 and SE2 are arranged in the active area AA. The sensing electrodes SE1 and SE2 may include the plurality of first sensing electrodes SE1 and the plurality of second sensing electrodes SE2 that intersect each other. The first sensing electrodes SE1 may extend in the first direction DR1 in rows that are arranged in the second direction DR2. Each of the first sensing electrodes SE1 may include a plurality of first sensing parts SP1 that are connected by a plurality of first intermediate parts BP1 arranged in the first direction DR1.

The second sensing electrodes SE2 may extend in the second direction DR2 like columns that are arranged in the first direction DR1. Each of the second sensing electrodes SE2 may include a plurality of second sensing parts SP2 that are connected by a plurality of second intermediate parts BP2 arranged in the second direction DR2.

The sensing lines SL1, SL2, and SL3 are disposed in the peripheral area NAA. The sensing lines SL1, SL2, and SL3 include the plurality of first sensing lines SL1, the plurality of second sensing lines SL2, and the plurality of third sensing lines SL3.

In the embodiment of FIG. 3, the first sensing lines SL1 are connected to each of the rows of the first sensing electrodes SE1 between the first row and the last row. To avoid overcrowding, FIG. 3 depicts the connection to the first row and the connection to the last row of the first sensing electrodes SE1, and uses " . . . " to indicate that the same type of connection is made to the rows between the first row and the last row of first sensing electrodes SE1. The second sensing lines SL2 are connected to each column of the second sensing electrodes SE2, with the connection points being on a first end (e.g., the top end) of the columns. To avoid overcrowding, FIG. 3 depicts select connections of the second sensing lines SL2 to the first end of the columns of second sensing electrodes SE2, and uses " . . . " to indicate that the same type of connection is made to the other columns. The third sensing lines SL3 are connected to each of the second sensing electrodes SE2, with the connection points being on a second end (e.g., the bottom end) of the columns. The connection relationship between the sensing electrodes SE1 and SE2 and the sensing lines SL1, SL2, and SL3 is not limited to what is depicted in FIG. 3.

Pad areas PDA1, PDA2, and PDA3 may be defined in the input sensor 220. The input sensor 220 may include sensing pads arranged in the pad areas PDA1, PDA2, and PDA3 adjacent to the active area AA. In an embodiment, the pad area may include the first pad area PDA1, the second pad area PDA2, and the third pad area PDA3. The sensing pads arranged in the first to third pad areas PDA1, PDA2, and PDA3 may be connected to the first sensing line SL1, the second sensing line SL2, and the third sensing line SL3, respectively. The first to third sensing lines SL1, SL2, and SL3 may electrically connect the sensing electrodes SE1 and SE2 and the sensing pads. In the embodiment of FIG. 3, the first end of the columns of second sensing electrodes SE2 are farther from the pad areas PDA1, PDA2, PDA3 than the second end of the columns of second sensing electrodes SE2.

A sealing area SMA (see FIG. 6) that partially overlaps the pad areas PDA1, PDA2, and PDA3 and overlaps the sealing member SM (see FIG. 1C) may be defined in the input sensor 220. The sealing area SMA (see FIG. 6) will be described below with reference to FIG. 6.

Figure 4A:
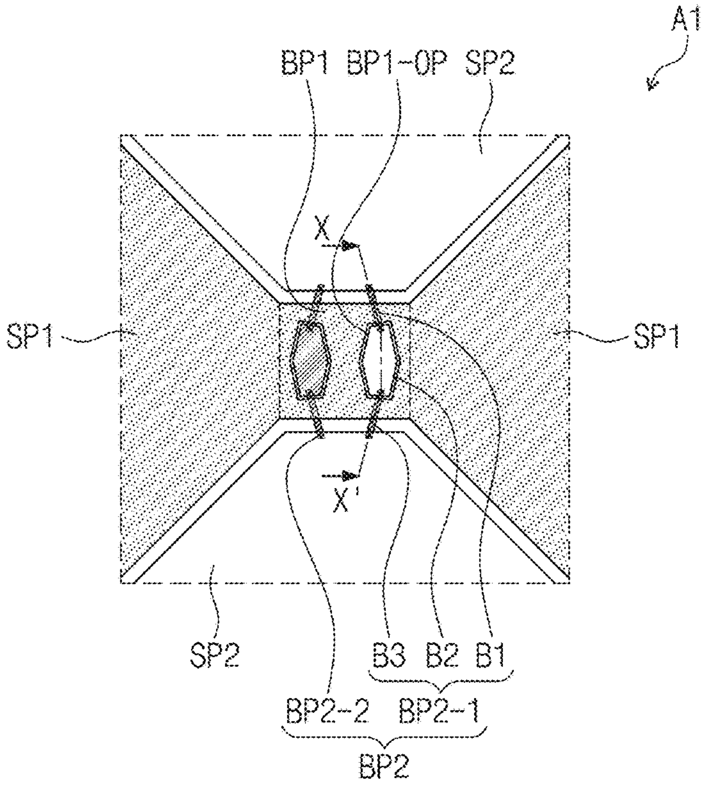
FIG. 4A is a plan view of a first area in FIG. 3.
Figure 4B:
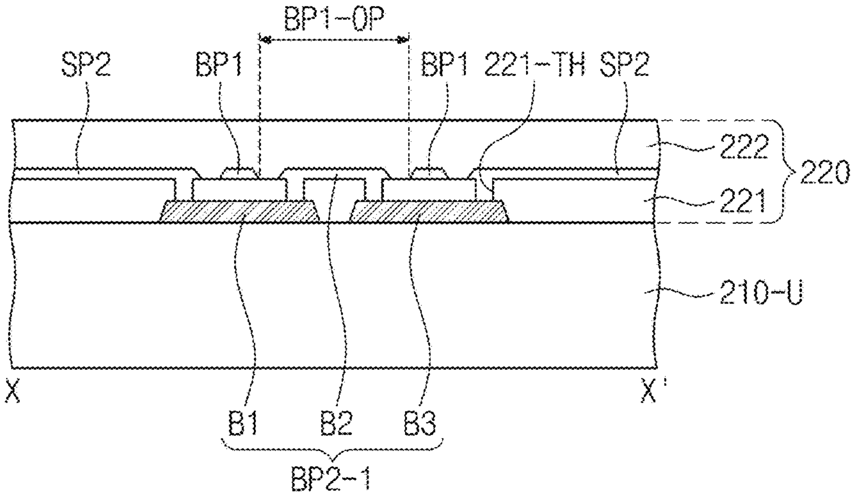
FIG. 4B is a cross-sectional view corresponding to line X-X' in FIG. 4A.

FIG. 4A is a plan view corresponding to an area A1 in FIG. 3. FIG. 4B is a cross-sectional view corresponding to line X-X' in FIG. 4A. Hereinafter, the input sensor 220 will be described in detail with reference to FIG. 3.

As illustrated in FIGS. 4A and 4B, the area A1 corresponds to an intersection area between the first sensing electrode SE1 and the second sensing electrode SE2. The first intermediate part BP1 and the second intermediate part BP2 are arranged in the intersection area. In an embodiment, adjacently-located first sensing parts SP1 and the first intermediate part BP1 may be formed continuously in an integrated manner. In contrast, adjacently-located second sensing parts SP2 may be separated from each other, with the second intermediate part BP2 connecting the two adjacently-located second sensing parts SP2. However, the embodiment depicted in FIG. 4A is an example and the present disclosure is not limited to the particular embodiment. In an embodiment, adjacently located first sensing parts SP1 may be separated from each other and connected by the first intermediate part BP1, and the second sensing part SP2 and the second intermediate part BP2 may be integrated.

The adjacently-located sensing parts not being integrated but being connected with the intermediate parts may form "an electrode pattern" (referring to the arrangement of the sensing parts) and "a bridge pattern" (referring to the arrangement of the intermediate parts). That is, in an embodiment, the second sensing electrode SE2 includes electrode patterns SP2 and bridge patterns BP2. Two bridge patterns BP2-1 and BP2-2 arranged in an intersection area are illustrated in FIG. 4A, but the this is not a limitation of the disclosure.

In an embodiment, the bridge pattern BP2 may include a first part B1, a second part B2, and a third part B3. The second part B2 is disposed on a different layer from the first part B1 and the third part B3. The second part B2 may be disposed at the same layer as the electrode patterns SP2. Each of the first part B1 and the third part B3 connects the second part B2 to a different part of the sensing part SP2.

As illustrated in FIGS. 4A and 4B, the input sensor 220 is directly disposed on an outer surface (or an upper surface) of the encapsulation substrate 210-U. In an embodiment, the encapsulation substrate 210-U including only the base substrate (hereinafter, referred to as the second base substrate) is illustrated, but this is not a limitation of the present disclosure. In an embodiment, a portion of the bridge pattern BP2 is in contact with an upper surface of the encapsulation substrate 210-U, but the present disclosure is not limited thereto. In an embodiment, a buffer layer may be further disposed on the upper surface of the encapsulation substrate 210-U, and a portion of the bridge pattern BP2 may be in contact with an upper surface of the buffer layer. The buffer layer may include an inorganic layer/organic layer.

In an embodiment, the input sensor 220 may not be directly disposed on the encapsulation substrate 210-U, and in this case, an adhesive layer may be disposed between the input sensor 220 and the encapsulation substrate 210-U. A base layer of the input sensor 220 may be coupled to the encapsulation substrate 210-U through the adhesive layer.

According to an embodiment, at least a portion of the bridge pattern BP2 is in contact with the upper surface of the encapsulation substrate 210-U. The first part B1 and the third part B3 may be arranged on the upper surface of the encapsulation substrate 210-U. The first part B1 and the third part B3 may include metal. The first part B1 and the third part B3 may include titanium (Ti), aluminum (Al), copper (Cu), gold (Au), or silver (Ag). The first part B1 and the third part B3 may be a multi-layer structure including a metal layer made of the metal.

A first insulating layer 221 is disposed on the upper surface of the encapsulation substrate 210-U. The first sensing electrode SE1, the electrode patterns SP2, and the second part B2 are arranged on the first insulating layer 221. An opening BP1-OP in which the second part B2 is to be disposed is defined in the first intermediate part BP1. The electrode patterns SP2 and the second part B2 may be connected to the bridge pattern BP2 through a through-hole 221-TH extending through the first insulating layer 221.

The first sensing electrode SE1, the electrode patterns SP2, and the second part B2 may include the same material. The first sensing electrode SE1, the electrode patterns SP2, and the second part B2 may include a transparent conductive oxide (TCO). The first sensing electrode SE1, the electrode patterns SP2, and the second part B2 may include an indium tin oxide (ITO), an indium zinc oxide (IZO), a zinc oxide (ZnO), and an indium tin zinc oxide (ITZO) and, in addition, may include poly(3,4-ethylenedioxythiophene) (PEDOT), metal nanowire, and graphene.

A second insulating layer 222 is disposed on the first insulating layer 221. The second insulating layer 222 may cover the first sensing electrode SE1, the electrode patterns SP2, and the second part B2. The first insulating layer 221 and the second insulating layer 222 may include inorganic materials and/or organic materials. Each of the first insulating layer 221 and the second insulating layer 222 may have a single layer or a plurality of layers.

In an embodiment, the bridge pattern BP2 may include only a metal pattern disposed on the upper surface of the encapsulation substrate 210-U. The bridge pattern BP2 may not intersect the first intermediate part BP1. The bridge pattern BP2 may overlap the first sensing parts SP1 to bypass the first intermediate part BP1. In this case, the second part B2 is disposed inside the first sensing part SP1.

Figure 5A:
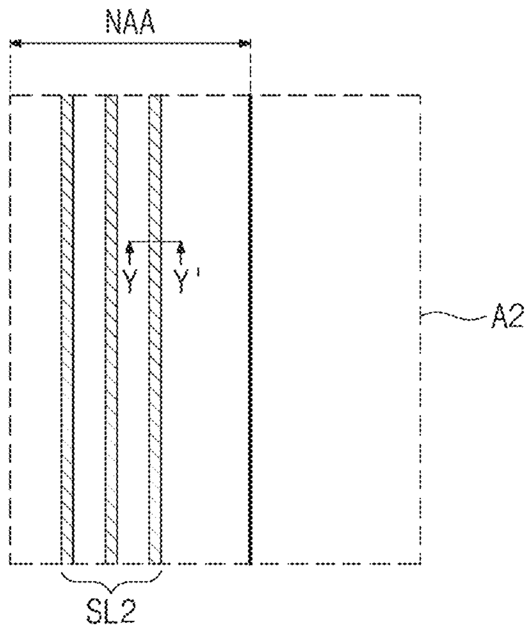
FIG. 5A is a plan view of area A2 in FIG. 3.
Figure 5B:
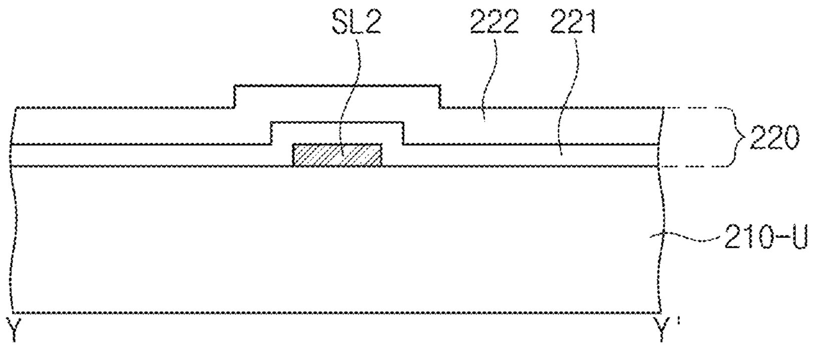
FIG. 5B is a cross-sectional view corresponding to line Y-Y' in FIG. 5A.
Figure 6:
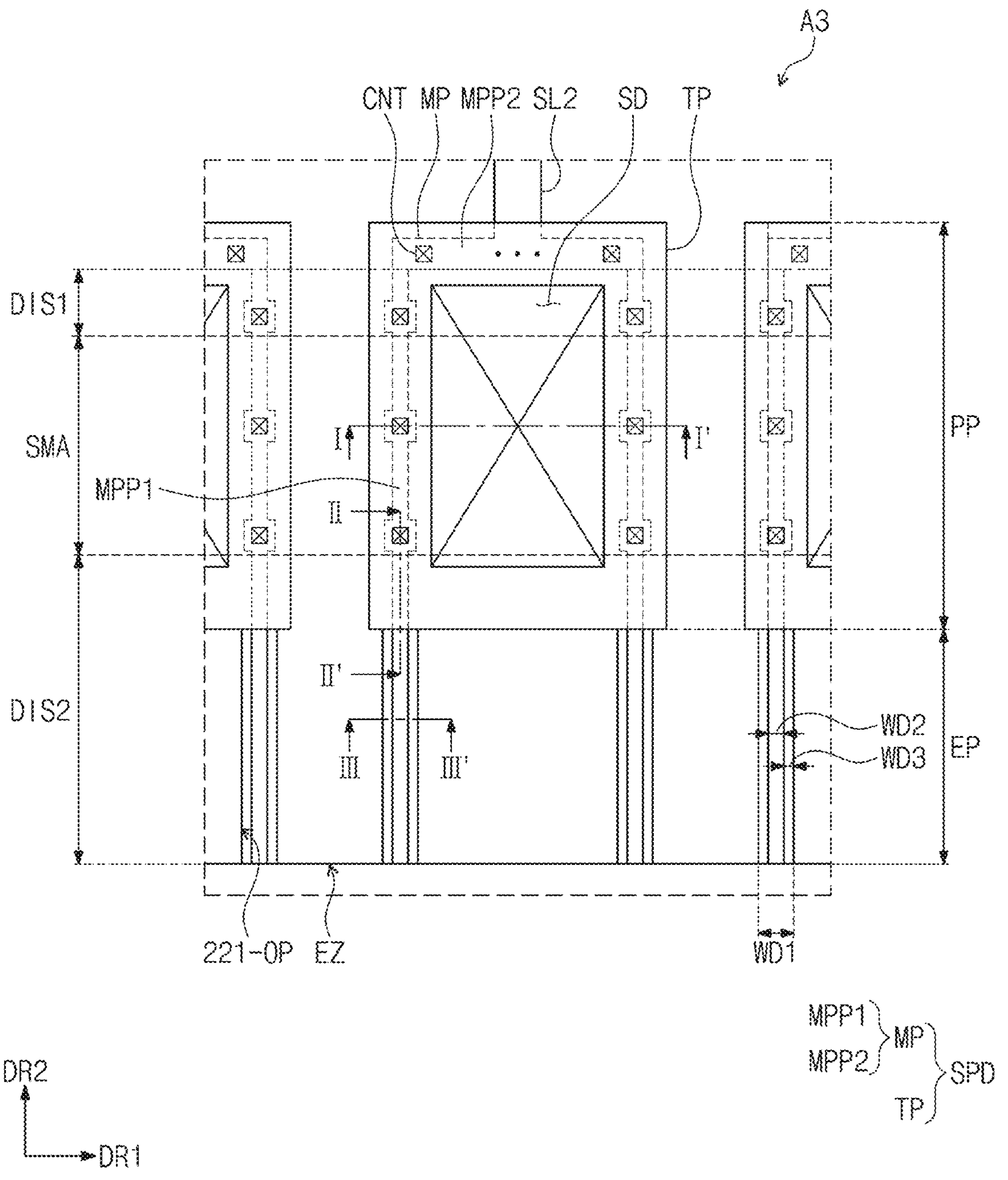
FIG. 6 is a plan view of area A3 in FIG. 3 according to an embodiment of the present disclosure.

FIG. 5A is a plan view of area A2 in FIG. 3. FIG. 5B is a cross-sectional view corresponding to line Y-Y' in FIG. 5A. FIG. 6 is a plan view of area A3 in FIG. 3. Hereinafter, the input sensor 220 will be described in detail with reference to FIGS. 3, 4A, and 4B.

Referring to FIGS. 5A, 5B, and 6, the sensing lines SL1, SL2, and SL3 may be connected to a sensing pad SPD. The sensing lines SL1, SL2, and SL3 may electrically connect the sensing electrodes SE1 and SE2 and the sensing pad SPD.

FIGS. 5A and 5B illustrate that the second sensing line SL2 is connected to the sensing pad SPD. The second sensing line SL2 may be disposed on the encapsulation substrate 210-U. In an embodiment, an insulating layer may be disposed between the second sensing line SL2 and the encapsulation substrate 210-U. The first insulating layer 221 may be disposed on the second sensing line SL2, and the second insulating layer 222 may be disposed on the first insulating layer 221.

The second sensing line SL2 may be formed through the same process as the first part B1, the third part B3, and a first pad MP of the bridge pattern BP2 and may include the same material.

In an embodiment, the second sensing line SL2 and the sensing pad SPD may be integrated. Unlike in FIGS. 5A, 5B, and 6, widths of the second sensing line SL2 and the sensing pad SPD may be the same.

In FIG. 6, the input sensor 220 may include the sensing pad SPD. FIG. 6 illustrates the second sensing line SL2 of the second pad area PDA2 and the sensing pad SPD connected to the second sensing line SL2 inside area A3 in FIG. 3, but the present disclosure is not limited thereto. The sensing pad SPD may include the first pad MP and a second pad TP. The second pad TP may be disposed on the first pad MP. The second pad TP may be disposed on a different layer from the first pad MP. The second pad TP may be disposed on the first insulating layer 221 and may be electrically connected to the first pad MP through a first contact hole CNT passing through the first insulating layer 221 (see FIG. 7A). The first pad MP may include metal. The first pad MP may include titanium (Ti), aluminum (Al), copper (Cu), gold (Au), and silver (Ag).

The second pad TP may be formed through the same process as the first sensing electrode SE1, the electrode patterns SP2, and the second part B2, and may include the same material. The second pad TP may include TCO. The second pad TP may include an ITO, an IZO, a ZnO, and an ITZO and, in addition, may include PEDOT, metal nanowire, and graphene.

The sensing pad SPD may include a pad part PP and an edge part EP. The pad part PP may be a part electrically connected to the flexible circuit board CF (see FIG. 1C), and the edge part EP may correspond to a part extending from the pad part PP to an edge EZ (hereinafter, referred to as an edge) of the encapsulation substrate 210-U (see FIG. 1C).

The pad part PP may include the first pad MP and the second pad TP of a pad part electrically connected to a pad of the flexible circuit board CF (see FIG. 1C) through an anisotropic conductive film, a solder ball, or the like. For example, the first pad MP of the pad part is connected to the sensing electrode through the second sensing line SL2 and is electrically connected to the second pad TP of the pad part through the first contact hole CNT. The pad part PP may partially overlap the sealing area SMA.

The first contact hole CNT may be provided as a plurality of first contact holes CNT. The second pad TP of the pad part may be exposed to the outside through a second contact hole SD and may be electrically connected to the pad of the flexible circuit board CF (see FIG. 1C) together with the first pad MP while in contact with the anisotropic conductive film or the solder ball.

The edge part EP may include the first pad MP of the edge part EP extending from the pad part PP to the edge EZ of the encapsulation substrate 210-U (see FIG. 1C). The first pad MP of the edge part may extend from the first pad MP of the pad part to the edge EZ. The first pad MP of the edge part may be integrated with the first pad MP of the pad part and extend continuously between the pad part PP and the edge part EP.

In the pad part PP, the second pad TP may be disposed on the first pad MP, and the first pad MP may be covered by the second pad TP. In the pad part PP, a portion of the first pad MP may overlap the second pad TP. The second pad TP may not overlap the edge part EP.

The sealing area SMA may extend in the first direction DR1 parallel to the edge EZ on a plane. The sealing area SMA may be spaced at a predetermined distance from the edge EZ in the second direction DR2. The sealing area SMA may be an area in which the sealing member SM (see FIG. 1C) of FIG. 1C is disposed.

The first pad MP may include a first portion MPP1 and a second portion MPP2. The first portion MPP1 may extend parallel to the second direction DR2. The second portion MPP2 may extend parallel to the first direction DR1. The first portions MPP1 may be provided as a plurality of first portions MPP1, which may be arranged with the second contact hole SD interposed therebetween. At least one first portion MPP1 among the plurality of first portions MPP1 may extend to the edge EZ.

The first portions MPP1 may be adjacent to both sides of the second contact hole SD and may extend parallel to the second direction DR2. The first portion MPP1 may be disposed between the second contact hole SD and an edge of the second pad TP in the first direction DR1. The first portion MPP1 may overlap the pad part PP and the edge part EP. The first portion MPP1 may extend to the edge EZ.

The first pad MP disposed between the sealing area SMA and the edge EZ may extend only in the second direction DR2 intersecting the first direction DR1, wherein the second direction DR2 is a direction in which the sealing area SMA extends.

The second portion MPP2 may be connected to the first portion MPP1 and may extend in the first direction DR1. The second portion MPP2 may be positioned outside of the edge part EP and the sealing area SMA. The second portion MPP2 may be disposed adjacent to an upper end of the second contact hole SD. The second portion MPP2 may not be disposed between the sealing area SMA and the edge EZ on a plane. The second portion MPP2 may be spaced farther apart from the edge EZ than from the sealing area SMA.

To reduce a dead space of the display device, a distance between the sealing area SMA and the edge EZ may be decreased, and accordingly, the second portion MPP2 and the sealing area SMA may be arranged close to each other. In this case, as in the present disclosure, the second portion MPP2 may be disposed outside the edge part EP, so as not to be present between the sealing area SMA and the edge EZ on a plane, and the second portion MPP2 including a metal material may be spaced apart from the sealing area SMA, for example by a first distance DIS1. Since the second portion MPP2 includes a metal material, when the sealing member SM (see FIG. 1C) is cured by laser, the laser may be reflected by the second portion MPP2.

The first distance DIS1 between the second portion MPP2 and the sealing area SMA may be in a range of about 40 μm or more. When the first distance DIS1 between the second portion MPP2 and the sealing area SMA is less than 40 μm and the sealing member SM (see FIG. 1C) is irradiated with laser for curing, the second portion MPP2 may reflect the laser and prevent the sealing member SM (see FIG. 1C) from being cured. Accordingly, an effective sealing width may be decreased, and the display device may not be securely held together. This weakness can be avoided with a first distance DIS1 of at least 40 μm between the second portion MPP2 and the sealing area SMA.

A second distance DIS2 between the sealing area SMA and the edge EZ in the second direction DR2 may be in a range of about 80 micrometers or less. When the second distance DIS2 between the sealing area SMA and the edge EZ is about 80 micrometers or less, the dead space of the display device EA (see FIG. 1A) may be decreased, and thus the display device EA (see FIG. 1A) having a wider display screen in the same area may be implemented. In this case, any effect on the curing of the sealing member SM (see FIG. 1C) because the sealing area SMA and the second portion MPP2 are too close to each other may be solved by ensuring that the second portion MPP2 is not disposed between the sealing area SMA and the edge EZ on a plane as described above.

An opening 221-OP that overlaps the edge part EP and extends to the first pad MP may be defined in the first insulating layer 221. A width WD1 of the opening 221-OP in the first direction DR1 may be about 14 μm. A width WD2 of the first pad MP overlapping the edge part EP in the first direction DR1 may be about 4 μm. A width WD3 between the first pad MP and the opening 221-OP in the first direction DR1 may be about 5 μm.

Figure 7A:
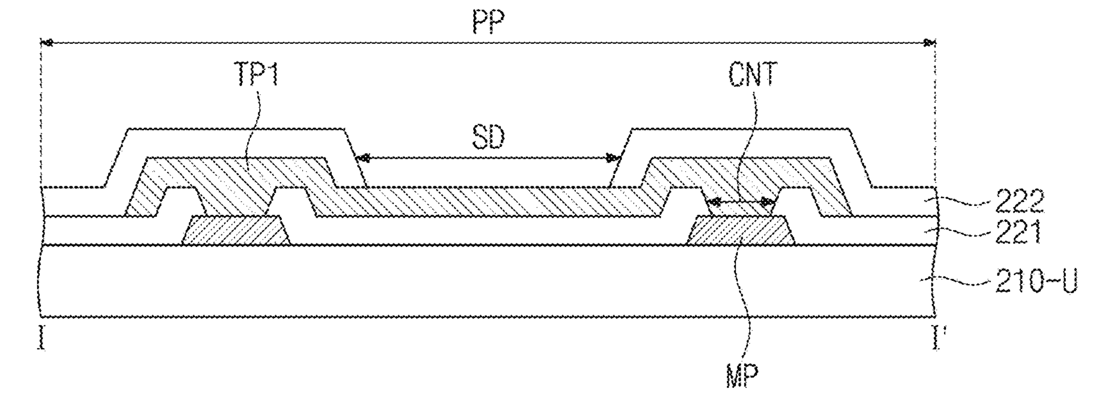
FIG. 7A is a cross-sectional view corresponding to line I-I' in FIG. 6.
Figure 7B:
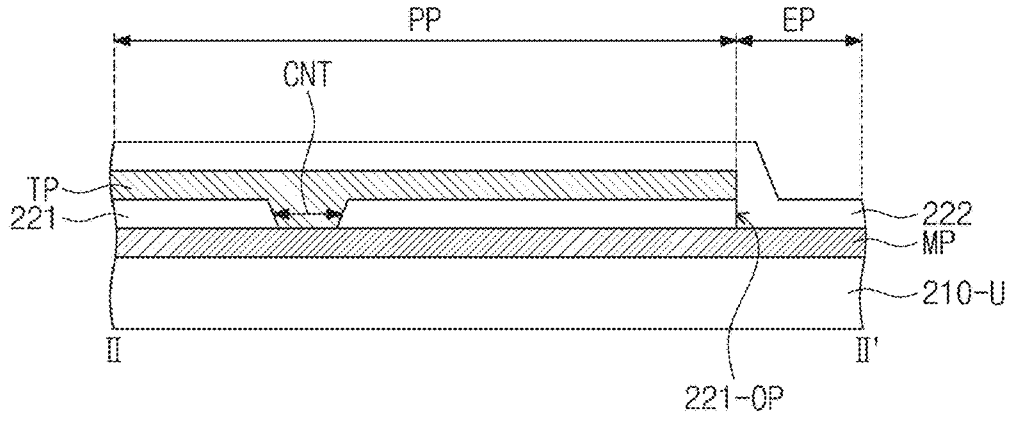
FIG. 7B is a cross-sectional view corresponding to line II-II' in FIG. 6.
Figure 7C:
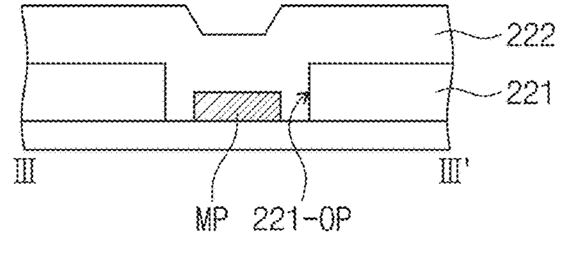
FIG. 7C is a cross-sectional view corresponding to line III-III' in FIG. 6.

FIG. 7A is a cross-sectional view corresponding to line I-I' in FIG. 6. FIG. 7B is a cross-sectional view corresponding to line II-II' in FIG. 6. FIG. 7C is a cross-sectional view corresponding to line III-III' in FIG. 6.

Referring to FIG. 7A, the pad part PP of the sensing pad SPD (see FIG. 6) is disposed on the encapsulation substrate 210-U. The first pad MP of the pad part PP may be directly disposed on the encapsulation substrate 210-U. The first insulating layer 221 is disposed on the first pad MP, and the second pad TP is disposed on the first insulating layer 221. The second insulating layer 222 may be disposed on the second pad TP. The first contact hole CNT is defined in the first insulating layer 221 in the pad part PP. The first pad MP and the second pad TP are electrically connected to each other through the first contact hole CNT. The second contact hole SD is defined in the second insulating layer 222 in the pad part PP. The second contact hole SD may extend to the second pad TP.

Referring to FIG. 7B, the first pad MP may overlap the pad part PP and the edge part EP. The second pad TP may overlap the pad part PP. The second insulating layer 222 may overlap the pad part PP and the edge part EP. The second insulating layer 222 may cover the first pad MP, the second pad TP, and the first insulating layer 221. In the edge part EP, the first pad MP may be covered by the second insulating layer 222.

Referring to FIG. 7C, the opening 221-OP that is positioned in the edge part EP (see FIG. 6) and extends to the first pad MP may be defined in the first insulating layer 221. The first pad MP may be exposed through the opening 221-OP, and the second insulating layer 222 may cover the exposed first pad MP.

Figure 8:
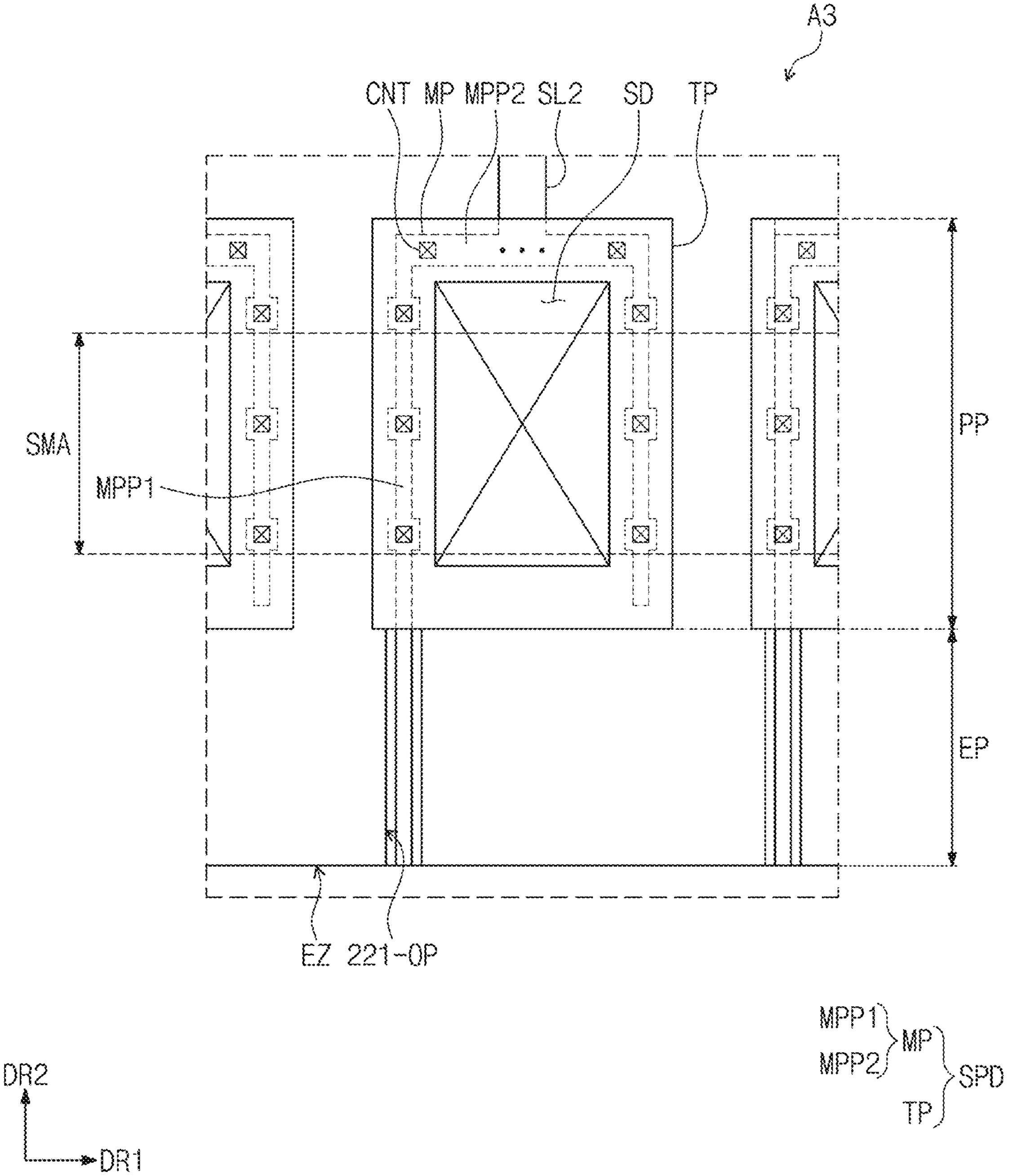
FIG. 8 is a plan view of area A3 in FIG. 3 according to an embodiment of the present disclosure.

FIG. 8 is a plan view of area A3 in FIG. 3 according to an embodiment of the present disclosure. FIG. 8 is the same as the plan view of FIG. 6 except for the number of first portions MPP1 extending toward the edge part EP, and thus a description of the same configuration will be omitted or simplified.

Referring to FIG. 8, in the one sensing pad SPD, only the one first portion MPP1 may extend to the edge EZ. In order for the one sensing pad SPD to be connected to a shorting bar 14 (see FIG. 10) in a manufacturing process, at least one first portion MPP1 should extend to the edge EZ. The number of first portions MPP1 extending to the edge EZ may be at least one, and the number of first portions MPP1 may be changed as needed.

Figure 9:
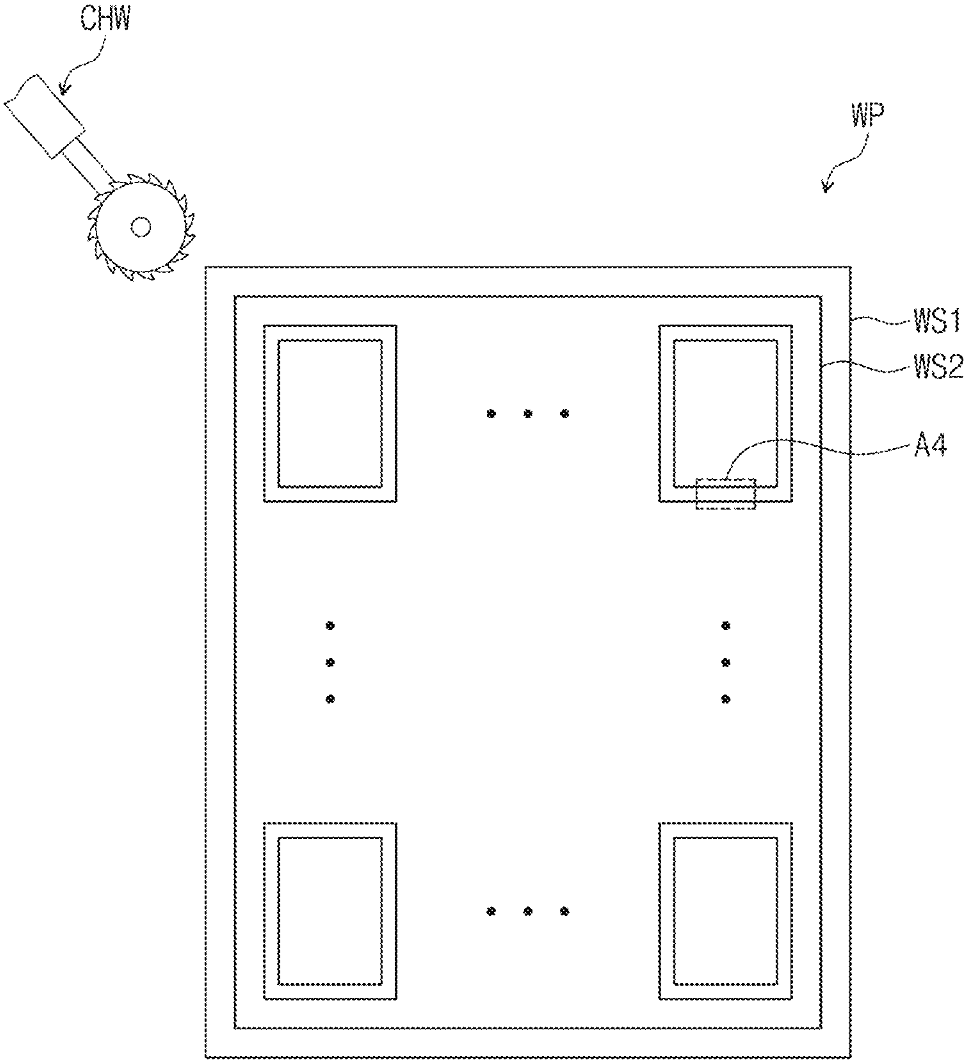
FIGS. 9 and 10 are plan views illustrating a method of manufacturing a display device according to an embodiment of the present disclosure.
Figure 10:
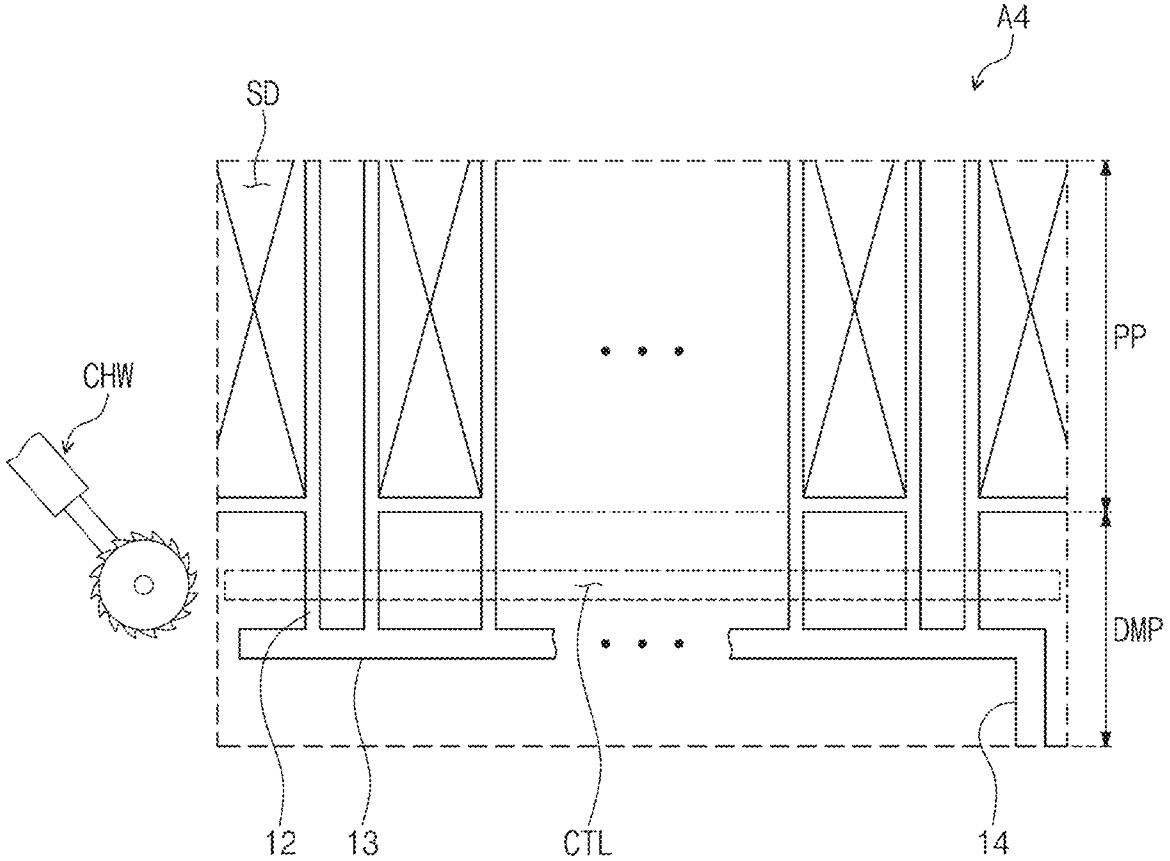

FIGS. 9 and 10 are plan views illustrating a method of manufacturing a display device according to an embodiment of the present disclosure.

Referring to FIG. 9, a mother substrate WP may correspond to a working panel that may be cut in cell units. The display device according to an embodiment of the present disclosure may be formed in each cell unit. A cutting wheel CHW may be used to cut the mother substrate WP into cell units. Here, the mother substrate WP may be formed by coupling a first working substrate WS1 and a second working substrate WS2. One of the first working substrate WS1 and the second working substrate WS2 may be an encapsulation substrate on which an input sensor is disposed, and the other one thereof may correspond to a display substrate on which a pixel or the like is disposed. Area A4 illustrates a pad area and a cut area of each substrate in cell units.

FIG. 10 illustrates the pad area and the cut area of the mother substrate WP in each cell unit. Referring to FIG. 10, a cut area CTL may extend from the pad part PP and may be defined in a dummy part DMP in which dummy pads connected to other cells are arranged. The dummy part DMP may include an edge part 12 extending from pads and overlapping the cut area CTL in the pad part PP, a connection part 13 connecting the edge parts 12 of the pads to each other, and a shorting bar 14 connecting the connection parts 13 of cells. The first pad MP (see FIG. 6) may be connected to the shorting bar 14. The shorting bar 14 may connect cell units before a cell process, thereby preventing defects due to static electricity in the display device.

According to the present disclosure, a first pad of an input sensor may not be disposed between a sealing area and an edge of a display panel, thereby preventing the first pad from interfering with curing of a sealing member. That is, even though a non-display area is narrowed, the first pad may be prevented from being disposed too close to the sealing member, thereby preventing the first pad from interfering with the curing of the sealing member.

As above, embodiments are disclosed in the drawings and the specification. Although specific terms are used herein, the terms are used only for describing the present disclosure and are not used to limit the meaning or the scope of the present disclosure described in the appended claims. Therefore, those skilled in the art will understand that various modifications and other equivalent embodiments may be made. Thus, the true technical protection scope of the present disclosure should be determined by the technical spirit of the appended claims.

What is claimed is:

1. A display device comprising:

a display panel including a first base substrate, a second base substrate, and a sealing member positioned at edges of the first base substrate between the first base substrate and the second base substrate; and an input sensor disposed on the display panel and including an active area, a pad area adjacent to the active area, and a sealing area partially overlapping the pad area and overlapping the sealing member, wherein the input sensor includes:

a sensing electrode configured to sense an input;

a sensing pad overlapping the pad area and including a first pad and a second pad disposed on a different layer from the first pad and electrically connected to the first pad; and a sensing line electrically connecting the sensing electrode and the sensing pad, wherein the sealing area extends in a first direction parallel to an edge of the display panel and is positioned a predetermined distance from the edge in a second direction intersecting the first direction, wherein the first pad includes a first portion having a length extending parallel to the second direction and a second portion having a length extending parallel to the first direction between a first end and a second end of the second portion, wherein the first portion is provided as a plurality of first portions, an end of one first portion among the plurality of first portions being connected to the first end of the second portion and an end of another first portion among the plurality of first portions being connected to the second end of the second portion, and wherein the second portion is disposed at least the predetermined distance from the edge of the display panel.

2. The display device of claim 1, wherein a distance between the sealing area and the edge of the display panel is 80 micrometers or less.

3. The display device of claim 1, wherein at least one first portion among the plurality of first portions extends to the edge of the display panel.

4. The display device of claim 1, wherein the sensing pad includes:

the first pad;

a first insulating layer disposed on the first pad;

the second pad disposed on the first insulating layer; and a second insulating layer disposed on the second pad.

5. The display device of claim 4, wherein the sensing pad includes:

a pad part partially overlapping the sealing area; and an edge part extending from the pad part to the edge of the display panel on a plane, and wherein an opening in the first insulating layer is positioned in the edge part and extends to the first pad.

6. The display device of claim 5, wherein a first contact hole electrically connecting the first pad and the second pad is defined in the first insulating layer overlapping the pad part.

7. The display device of claim 5, wherein a second contact hole exposing the second pad is defined in the second insulating layer overlapping the pad part.

8. The display device of claim 5, wherein the second insulating layer covers the second pad.

9. The display device of claim 5, wherein the second pad is positioned outside of the edge part.

10. The display device of claim 1, wherein the second portion is spaced farther apart from the edge than from the sealing area.

11. The display device of claim 1, wherein the display panel further includes:

a circuit element layer disposed between the first base substrate and the second base substrate; and a display element layer disposed on the circuit element layer.

12. The display device of claim 1, wherein the first pad includes metal, and the second pad includes a transparent conductive oxide.

13. The display device of claim 1, wherein a distance between the second portion and the sealing area is 40 μm or more.

14. The display device of claim 1, wherein the first pad is in contact with an upper surface of the second base substrate.

15. An electronic device comprising:

an electronic panel; and a window member disposed on the electronic panel, wherein the electronic panel comprises:

a display panel including a first base substrate, a second base substrate, and a sealing member positioned at edges of the first base substrate between the first base substrate and the second base substrate; and an input sensor disposed on the display panel and including an active area, a pad area adjacent to the active area, and a sealing area partially overlapping the pad area and overlapping the sealing member, wherein the input sensor includes:

a sensing electrode configured to sense an input;

a sensing pad overlapping the pad area and including a first pad and a second pad disposed on a different layer from the first pad and electrically connected to the first pad; and a sensing line electrically connecting the sensing electrode and the sensing pad, wherein the sealing area extends in a first direction parallel to an edge of the display panel and is spaced a predetermined distance from the edge, and wherein the first pad includes:

a first portion disposed between the sealing area and the edge and having a length that extends only in a second direction that is nonparallel to the edge; and a second portion having a length parallel to the first direction between a first end and a second end of the second portion, wherein the first portion is provided as a plurality of first portions, an end of one first portion among the plurality of first portions being connected to the first end of the second portion and an end of another first portion among the plurality of first portions being connected to the second end of the second portion.

16. The electronic device of claim 15, wherein a distance between the sealing area and the edge of the display panel is 80 micrometers or less.

17. The electronic device of claim 15, wherein the sensing pad includes:

the first pad;

a first insulating layer disposed on the first pad;

the second pad disposed on the first insulating layer; and a second insulating layer disposed on the second pad.

18. The electronic device of claim 17, wherein the sensing pad includes:

a pad part partially overlapping the sealing area; and an edge part extending from the pad part to the edge of the display panel, wherein an opening in the first insulating layer is positioned in the edge part and extends to the first pad.

19. The electronic device of claim 18, wherein a first contact hole electrically connecting the first pad and the second pad is defined in the first insulating layer overlapping the pad part.

20. The electronic device of claim 15, wherein the first pad includes metal, and the second pad includes a transparent conductive oxide.

* * * * *